United States Patent [19]

Harris et al.

[11] Patent Number: 4,843,447
[45] Date of Patent: Jun. 27, 1989

[54] HOT CHARGE-CARRIER TRANSISTORS

[75] Inventors: Jeffrey J. Harris, Haywards Heath; John M. Shannon, Whyteleafe; John M. Woodcock, Tunbridge Wells, all of England

[73] Assignee: U.S. Philips Corp., New York, N.Y.

[21] Appl. No.: 53,768

[22] Filed: May 22, 1987

[30] Foreign Application Priority Data

May 23, 1986 [GB] United Kingdom ............... 8612605

[51] Int. Cl.$^4$ .................. H01L 29/205; H01L 29/72
[52] U.S. Cl. ........................................ 357/34; 357/16
[58] Field of Search ................................... 357/16, 34

[56] References Cited

U.S. PATENT DOCUMENTS 4,682,196  7/1987  Sakai et al. ..................... 357/16

FOREIGN PATENT DOCUMENTS 2056166  3/1981  United Kingdom .............. 357/34

OTHER PUBLICATIONS

Yokoyama et al, *Jap. Jnl. of Appl. Phys.*, Vol. 23, No. 5, May 1984, pp. L311–L312, "Tunnelling... Heterojunctions".

*Primary Examiner*—Andrew J. James
*Assistant Examiner*—Jerome Jackson, Jr.
*Attorney, Agent, or Firm*—Steven R. Biren

[57] ABSTRACT

Current flow through the base region of a hot charge-carrier transistor is by hot majority charge-carriers (i.e. hot electrons for a hot electron transistor) which are injected into the base region at an emitter-base barrier region. This barrier region is doped with an impurity of the opposite conductivity type (p type for a hot electron transistor) and is sufficiently thin as to form a bulk unipolar diode with an adjacent part of the base region. In accordance with the invention, the emitter-base barrier region is of different bandgap semiconductor material (for example, gallium aluminum arsenide) compared with that (for example, gallium arsenide) of the base region so as to form a heterojunction. The barrier height of this barrier region is determined in part by the opposite-type doping and in part by the heterojunction and can be made large so as to increase the energy of the injected charge-carriers and hence the collector efficiency of the transistor. Furthermore the bandgap structure of the different materials can provide a step in the minority-carrier band edge (i.e. the valence band edge for a hot electron transistor) which reduces the depth of a potential well for the minority carriers, thereby effecting a reduction in the trapping of minority charge-carriers in the barrier region (2) while a desirably high barrier height for the majority carrier injection is still obtained.

7 Claims, 2 Drawing Sheets

HOT CHARGE-CARRIER TRANSISTORS

BACKGROUND OF THE INVENTION

This invention relates to hot charge-carrier transistors having a base region through which current flow is by hot majority charge-carriers, and relates particularly but not exclusively to hot electron transistors formed with monocrystalline gallium arsenide and suitable for operation at room temperature.

Published United Kingdom patent application No. 2 056 166 discloses hot charge-carrier transistors comprising a base region through which current flow is by hot charge-carriers of one conductivity type. Barrier-forming means forms a base-collector barrier with said base region. An emitter-base barrier region which is doped with impurity of the opposite conductivity type is sufficiently thin as to form with a part of the base region of said one conductivity type a bulk unipolar diode for injection of the hot charge-carriers of said one conductivity type into the base region during operation of the transistor. These transistors are suitable for operation at room temperature.

In the transistors described in GB Pat. No. 2 056 166, the emitter-base barrier region is undepleted over a part of its thickness by the depletion layer or layers present at the emitter-base barrier at zero bias. The application of a minimum bias voltage is necessary to establish (by avalanche breakdown, inter-band tunnelling or depletion-layer punch-through) a supply of hot majority charge-carriers having energies above the base-collector barrier; this improves the collection efficiency of the transistor as described in GB Pat. No. 2 056 166. The present invention may be incorporated in transistors having such an emitter-base barrier region, but it may also be incorporated in transistors in which the doped emitter-base barrier region is substantially depleted across the whole of its thickness at zero bias, for example as described in U.S. Pat. No. 4149174.

Several particular examples of these transistors are described in GB Pat. No. 2 056 166. In the hot electron device structures of FIGS. 3 and 4, there are possible sources of free minority carriers (holes), for example the undepleted p type part of the barrier region 4, an undepleted p type guard ring 11, and electron-hole pair generation in the case of avalanche breakdown of the barrier region 4. There are circumstances in which these free minority carriers in the transistor structure may be trapped by the emitter-base barrier region 4 during operation of the transistor, and such minority carrier storage in the emitter-base barrier region 4 may reduce the barrier height, increase the capacitance and reduce the speed of the transistor.

In the FIG. 3 device structure in GB Pat. No. 2 056 166 both the base region 2 and emitter-base barrier region 4 are formed by ion implantation and extend to the top major surface of a silicon device body where the base region 2 is contacted by the base contact 8 at an area adjoining the p type guard ring 11. In the FIG. 7 device structure, both the base region 2 and the emitter-base barrier region 4 are formed by molecular beam epitaxy of appropriately-doped gallium arsenide, and the gallium arsenide barrier region 4 is removed from the area where the base contact 8 is to be provided. Although the gallium arsenide base region 2 has a very high opposite conductivity type doping compared to those of the emitter-base and base-collector barrier regions 4 and 1, much care is needed to ensure that the etching process is terminated after the region 4 is removed but before the region 1 is reached.

SUMMARY OF THE INVENTION

According to the present invention, there is provided a hot charge-carrier transistor comprising a base region through which current flow is by hot charge-carriers of one conductivity type, barrier-forming means which forms a base-collector barrier with said base region, and an emitter-base barrier region which is doped with impurity of the opposite conductivity type and which is sufficiently thin as to form with a part of the base region of said one conductivity type a bulk unipolar diode for injection of the hot charge-carriers of said one conductivity type into the base region during operation of the transistor, the transistor being characterized in that the emitter-base barrier region is of different bandgap semiconductor material compared with an adjacent part of the base region so as to form a heterojunction, and that the barrier height of the emitter-base barrier region for the hot charge-carriers of said one conductivity type is partly determined by the impurity of said opposite conductivity type and partly determined by the heterojunction.

This provision of the emitter-base barrier region with said heterojunction permits several advantages to be obtained in a hot charge-carrier transistor in accordance with the invention. Thus, the emitter-base barrier region may be of wider bandgap material forming the heterojunction with the adjacent part of the base region to increase the barrier height of the emitter-base barrier region. Depending on the nature of the emitter, the application of a higher minimum emitter-base bias voltage may then be required before a comparable supply of hot charge-carriers is established by injection from the emitter, and these hot charge-carriers when injected will have a higher energy relative to the base region and base-collector barrier so improving the collection efficiency of the transistor. The provision of this heterojunction can also facilitate the formation of a connection to the base region. Thus, the different bandgap material of the emitter-base barrier region may be selectively etchable with respect to the adjacent part of the base region, and such a selective etching treatment may be employed in the provision of a base connection which contacts the base region at an area of said adjacent part of the base region from which the different bandgap material is removed. Furthermore, the bandgap structure of the different materials can be chosen to provide a step in the minority-carrier band edge which reduces the depth of a potential well for the minority carriers thereby effecting a reduction in the trapping of minority charge-carriers by the barrier region. Thus, with a hot electron transistor, the valence band step at said heterojunction is preferably such that the valence band edge in the barrier region is at a higher hole energy than the valence band edge in the adjacent part of the base region. For a hot hole transistor, there is preferably a conduction band step from the barrier region to a lower electron energy level in the base region.

It should be noted that the article entitled "Development of Hot Electron Transistor shows Potential as High-Speed Device" in JEE (Journal of Electronic Engineering - Japan), October, 1985, pages 30 to 34, describes an emitter-base barrier region of wider bandgap semiconductor material than the adjacent base region; however the barrier height is determined wholly by the heterojunction since opposite conductivity type doping is not used in this transistor. This limits the maximum barrier height for both the emitter-base and base-collector barrier regions to the maximum heterojunction conduction band step (about 0.4 eV), and consequently the transistor needs to be operated at cryogenic temperatures (e.g. 40° K) to reduce leakage currents. By contrast however the present invention permits the design of transistors for operation at higher temperatures (for example room temperature) due to the barrier height being partly determined by the opposite conductivity type impurity. By choosing an appropriately high doping level for this impurity and/or an appropriately wide thickness for the doped barrier region, the barrier height of the emitter-base barrier region of a transistor in accordance with the present invention can be made significantly higher than a moderately high base-collector barrier, thus aiding collector efficiency.

BRIEF DESCRIPTION OF THE DRAWING

These and other features in accordance with the present invention are illustrated more specifically in embodiments of the invention now to be described, by way of example, with reference to the accompanying diagrammatic drawings, in which.

Figure 1:
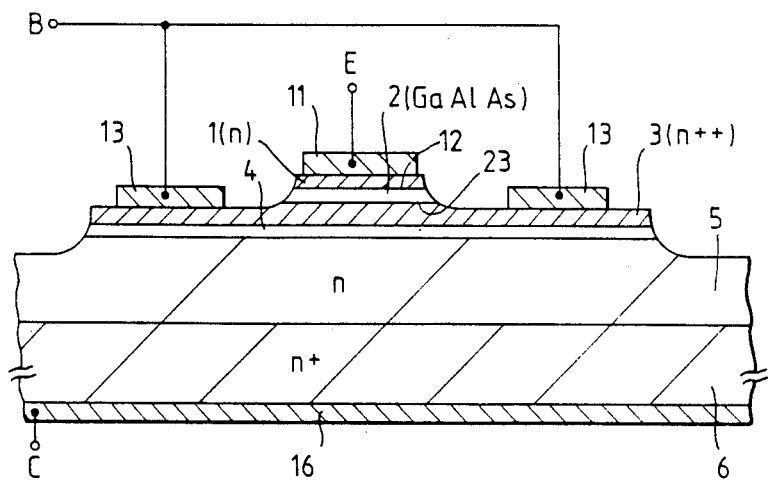
FIG. 1 is a cross-sectional view of part of a semiconductor body comprising a hot electron transistor in accordance with the invention.

It should be noted that all the Figures are diagrammatic and not drawn to scale. The relative dimensions and proportions of parts of these Figures (particularly in the direction of thickness of layers) have been shown exaggerated or diminished for the sake of clarity and convenience in the drawings. The same reference signs as used in one embodiment are generally used when referring to corresponding or similar parts in other embodiments. The thin depleted emitter-base and base-collector barrier regions are not hatched in the cross-section of FIG. 1.

DESCRIPTION OF THE PREFERRED EMBODIMENTS

FIG. 1 illustrates one particular structure for a hot charge-carrier transistor in accordance with the invention. The device is a hot electron transistor, having an n type base region 3 through which current flow is by hot electrons. However it will be appreciated that the invention may be used in the construction of a hot hole transistor having opposite conductivity type regions to the corresponding regions of a hot electron transistor. Hot charge carriers are those which are not in thermal equilibrium with the lattice. Thus, the average energy of hot electrons is considerably more than a few k.T above the average energy of electrons in equilibrium with the lattice (where k and T are the Boltzman constant and the lattice temperature respectively). At room temperature k.T is about 25 meV.

The transistor illustrated in FIG. 1 comprises a monocrystalline semiconductor body including semiconductor regions 1 to 6. The region 4 forms a base-collector barrier with the base region 3. An emitter-base barrier region 2 which is doped with impurity of opposite conductivity type (p type) to that of the hot charge-carriers (electrons) is sufficiently thin as to form with a part of the n type base region 3 a bulk unipolar diode for injection of the hot electrons into the base region 3 during operation of the transistor.

In accordance with the present invention (and unlike the similar hot electron transistor illustrated in FIG. 7 of GB Pat. No. 2 056 166) the emitter-base barrier region 2 is of different bandgap semiconductor material than the adjacent part of the base region 3 so as to form a heterojunction 23 which preferably increases the barrier height (h) of the emitter-base barrier region 2 for the electrons. This increase is illustrated as x in FIG. 2. The proportion ((h - x) in FIG. 2) of the barrier height determined by the p type impurity in the region 2 is, however, larger than that (x) determined by the heterojunction 23.

The base-collector barrier region 4 may be of the same bandgap semiconductor material as the base region 3 thereby reducing quantum mechanical reflections. The base-collector barrier may be formed, for example, by a bulk unipolar diode of the type described is U.S. Pat. No. 4,149,174. Thus, the region 4 may have a p type impurity concentration the magnitude of which determines the height of the potential barrier to the flow of electrons from the base region 3 to an n type collector region 5,6. The barrier region 4 is sufficiently thin that depletion layers which it forms at zero bias with both the base and collector regions merge together in the region 4 to substantially deplete the whole of the region 4 of holes even at zero bias. To obtain such depletion at zero bias, the thickness and doping level of the region 4 must satisfy certain conditions as described in U.S. Pat. No. 4 149 174, while the height of the barrier is determined by the doping level of the region 4. In the form illustrated in FIG. 1, the collector region comprises an n-type epitaxial layer 5 on a highly doped n type substrate 6 with a metal layer 16 providing a collector electrode.

The emitter-base barrier region 2 is sufficiently thin to be depleted of holes at least during operation of the transistor. It may be such as to be undepleted over a part of its thickness at zero bias, as for example with the emitter-base barrier regions described in GB Pat. No. 2 056 166. However it may be depleted over the whole of its thickness even at zero bias, as with the barrier regions described in U.S. Pat. No. 4,149,174. This barrier region 2 is preferably of wider bandgap material than the base region 3 which in the form illustrated in FIG. 1 comprises a single highly-doped n type semiconductor region (n++) with a metal layer 13 providing a base electrode. In the particular form illustrated by way of example in FIG. 1 the transistor has a low-doped n type emitter region 1 with which a metal layer 11 forms an ohmic contact to provide an emitter electrode.

The transistor of FIG. 1 may be formed with, for example, a monocrystalline gallium arsenide substrate 6 on which epitaxial layers are grown using molecular-beam epitaxial growth equipment. By molecular beam epitaxy of gallium arsenide, the n type collector region layer 5, the p type doped barrier region 4 and n type base region 3 can be grown sequentially with appropriate doping. A Knudson cell source of aluminum may additionally be used during the molecular beam epitaxial growth of the p type doped barrier region 2 to form the region 2 of a mixed crystal of gallium aluminum arsenide. The aluminum cell source may be subsequently shuttered close to grow the final n type layer 1 of gallium arsenide. The two upper layers 1 and 2 are locally removed throughout their thickness by etching to leave the emitter mesa structure illustrated for the regions 1 and 2 in FIG. 1, after which the two layers 3 and 4 are also locally removed throughout their thickness to leave the base mesa structure illustrated for the regions 3 and 4 in FIG. 1.

The termination of the mesa etching for the regions 3 and 4 is not critical due to the large thickness of the layer 5. The base region 3 is however of comparatively small thickness so that the etching process for defining the emitter mesa 1 and 2 must be terminated with sufficient control to avoid etching through the exposed base region 3. This is achieved in accordance with the present invention by the wider bandgap material (gallium aluminum arsenide) of the emitter-base barrier region 2 being selectively etchable with respect to the adjacent (gallium arsenide) part of the base region 3. Several selective etchants are available for gallium aluminum arsenide on gallium arsenide, for example a wet etch solution of ammonia and hydrogen peroxide in water. The base connection 13 is then provided at an area of the adjacent part of the base region 3 from which the wider bandgap material 2 is removed.

In a typical specific example, the transistor of FIG. 1 may have the following thickness and doping concentrations for the regions 1 to 5:

GaAs emitter region 1: about 400 nm (nanometers) thick, doped with about $10^{16}$ silicon or tin atoms cm$^{-3}$ GaAlAs region 2: about 20 nm thick, doped with about $2 \times 10^{18}$ beryllium atoms cm$^{-3}$ GaAs base region 3: about 25 nm thick, doped with about $5 \times 10^{18}$ silicon atoms cm$^{-3}$ GaAs region 4: about 15 nm thick, doped with about $3 \times 10^{18}$ beryllium atoms cm$^{-3}$ GaAs collector region 5: about 1 $\mu$m (micrometer) thick, doped with about $10^{16}$ silicon or tin atoms cm$^{-3}$ An aluminum arsenide mole fraction of about 0.4 may be used for the GaAlAs of the barrier region 2. With such a composition the proportion x of the barrier height contributed by the conduction band step at the heterojunction 23 is about 0.35 eV whereas the proportion (h - x) contributed by the beryllium doping is about 0.6 eV, giving a total barrier height (h) of about 0.95 eV for the emitter-base barrier region 2. This hot electron transistor can be operated satisfactorily at room temperature (300° K.).

Figure 2:
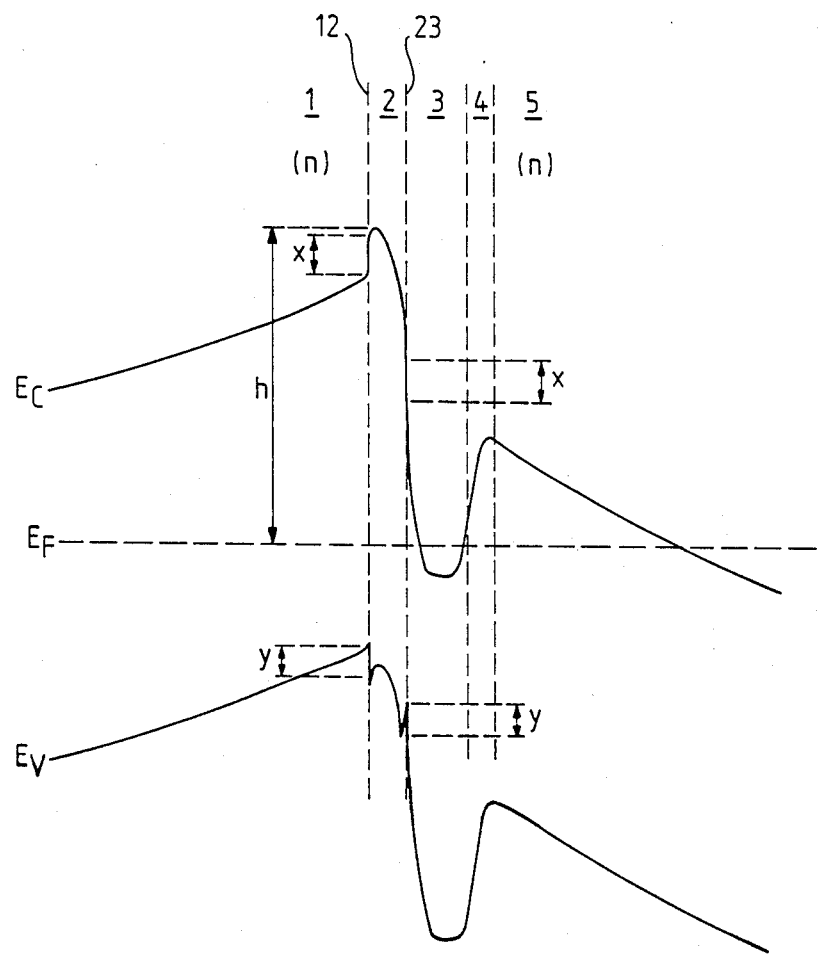
FIG. 2 is an energy diagram through the active part of the transistor of FIG. 1, showing both conduction and valence band edges $E_c$ and $E_v$ respectively.

FIG. 2 illustrates also the effect of the heterojunction 23 on the valence band edge $E_v$. The valence band step y is in the opposite direction to and smaller than the conduction band step x at the heterojunction 23. Thus, the valence band edge in the emitter-base barrier region 2 is at a higher hole energy (i.e. a lower electron energy by y eV) than the valence band edge in the adjacent part of the base region 3; in the particular example of a GaAs base region 3 and a Ga$_{0.6}$Al$_{0.4}$. As barrier region 2, x is about 0.35 eV whereas y is about 0.15 eV. Thus, in this particular example with a total barrier height h for electrons of about 0.95 eV, the corresponding well for holes is only about 0.6 eV so reducing the tendency for holes (i.e. minority carriers in the device) to be trapped and stored in the emitter-base barrier region 2 of a given height h.

In the arrangement illustrated in FIGS. 1 and 2, the depleted p type doped barrier region 2 also forms a heterojunction 12 with the n type emitter region 1 of, for example, GaAs. Thus, x is the same on both the emitter and base sides of the region 2. However, the emitter region 1 may be of wide bandgap material, for example the same gallium aluminum arsenide material as the barrier region 2; this increases the emitter resistance. The material of the emitter region 1 may also be a graded composition with an AlAs mole fraction varying progressively from a layer of gallium arsenide adjacent the top surface to gallium aluminum arsenide with the AlAs mole fraction of the barrier region 2 at the interface 12. Furthermore the emitter region 1 may be of opposite conductivity type (p type in this example) to that of the base region 3 and be sufficiently low doped as to form a Schottky barrier with an emitter electrode 11. It is also possible for very thin, intrinsic (i.e. undoped or unintentionally doped) layers to be present between the depleted p type doped barrier region 2 and the emitter and base regions 1 and 3 and between the depleted p type doped barrier region 4 and the base and collector regions 3 and 5. The semiconductor emitter region 1 may be omitted when a Schottky electrode 11 is provided.

Figure 3:
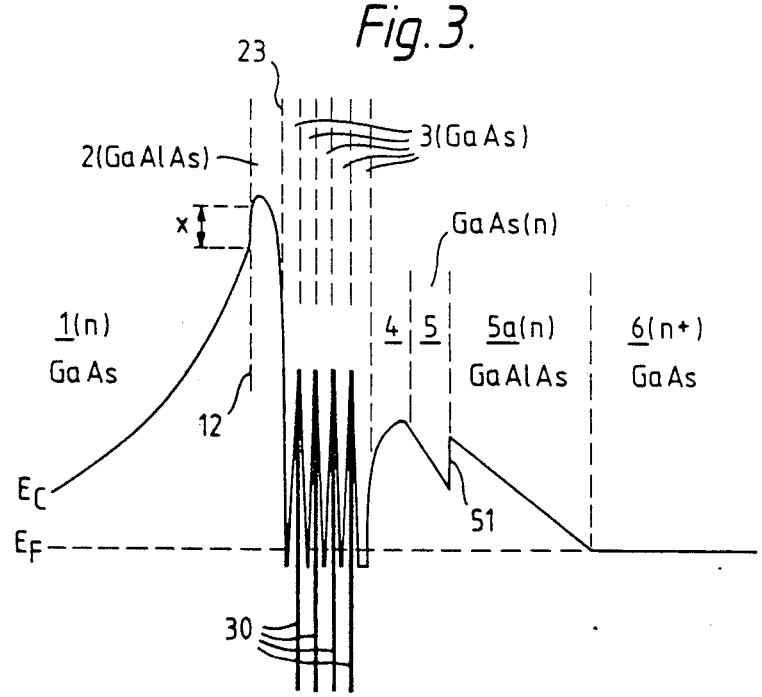
FIG. 3 is an energy diagram through the active part of another transistor also in accordance with the invention, showing the conduction band edge $E_c$.

Some further heterojunction modifications which may be included in a hot carrier transistor in accordance with the invention are illustrated in FIG. 2. Thus, semiconductor material 5a of a wider bandgap (for example GaAlAs) may be present within the collector region 5,6 (otherwise of for example GaAs) to form a heterojunction 51 providing an electric field which retards the hot charge-carriers in the collector region 5,6 in the vicinity of the base-collector barrier region 4. The bandgap of the material 5a is larger than that of the base-collector barrier region 4 (for example GaAs), and the heterojunction 51 in the arrangement of FIG. 3 is spaced parallel from the base-collector barrier region by the narrow bandgap (for example GaAs) part 5 of the collector region. With this arrangement a high collector field is maintained in the part 5 in the immediate vicinity of the potential maximum of region 4 serving for efficient collection of the hot electrons, and the hot electrons are then cooled by the retarding field at the heterojunction 51 so reducing a tendency to create electron-hole pairs by ionization in the collector region and thus reducing hole trapping and storage in the base-collector barrier region 4. A series of mutually spaced wider-bandgap layers 5a may be included to provide a series of retarding heterojunctions 51 in the collector region part 5.

Furthermore, as illustrated in FIG. 3, at least one metal-based layer 30 may be included in the base region 3 parallel to the barrier region 4 to reduce the base resistance. In order to aid efficient transmission of the hot charge-carriers through the base region 3 and 30, the metal-based layer 30 is very thin (for example about 1 nm thick) to permit quantum mechanical tunnelling. When GaAs is used for the semiconductor region 3, the layer 30 may be of, for example, epitaxial aluminum. Metal silicides may be used in the case of silicon transistors. Very low base resistances can be obtained by incorporating thin metal-based layers 30 in the transistor base. A series arrangement of alternate layers of semiconductor material 3 and metal-based material 30 may be employed in the base region.

In the particular example described above, the p type doped barrier region 2 is of gallium aluminum arsenide and at least the base region 3 is of n type GaAs. There are however a wide variety of other materials which may be used. Thus, for example, the emitter and base regions 1 and 3 may be of gallium antimonide and the emitter-base barrier region 2 may be of gallium indium arsenide. Transistors in accordance with the invention may also be formed with silicon; thus, for example, the emitter and barrier regions 1 and 2 may be of silicon epitaxially grown on a single-crystal layer 3 of germanium-silicon alloy which provides the base region. The bandgap of the material of the emitter-base barrier region 2 may in some cases be about the same or even smaller than that of the base region 3, but with a shift along the energy axis so that the minority-carrier band edge in the barrier region 2 is shifted with respect to that in the base region 3 so as to reduce minority-carrier trapping.

We claim:

1. A hot charge-carrier transistor comprising a base region through which current flow is by hot majority charge-carriers of one conductivity type, barrier-forming means which forms a base-collector barrier with said base region, an emitter region, and an emitter-base barrier region adjacent said emitter region and which is doped with impurity of the opposite conductivity type and which is sufficiently thin as to form with a part of the base region of said one conductivity type a bulk unipolar diode for injection of the hot charge-carriers of said one conductivity type into the base region during operation of the transistor, wherein the emitter-base barrier region is of different bandgap semiconductor material than an adjacent part of the base region so as to form a heterojunction, and comprising means for determining the barrier height of the emitter-base barrier region for the hot charge-carriers of said one conductivity type partly by the impurity of said opposite conductivity type and partly by the heterojunction, said one conductivity type being n type to provide a hot electron transistor and a valence band step occurring at said heterojunction such that the valence band edge in the emitter base barrier region is at a higher hole energy than the valence band edge in the adjacent part of the base region.

2. A transistor as claimed in claim 1 or further characterized in that the emitter-base barrier region is of wider bandgap material than the adjacent part of the base region, that the heterojunction increases the barrier height of the emitter-base barrier region, and that the proportion of said barrier height determined by the impurity of said opposite conductivity type is larger than that determined by the heterojunction.

3. A transistor as claimed in claim 2, further characterized in that both the emitter-base barrier region and emitter region adjacent the emitter-base barrier region are of wider bandgap material than the part of the base region adjacent the emitter-base barrier region.

4. A transistor as claimed in claim 2, further characterized in that the emitter-base barrier region is of wider bandgap material than the adjacent parts of both the base region and the emitter region.

5. A transistor as claimed in claim 3 further characterized in that the emitter region is of said one conductivity type.

6. A transistor as claimed in claim 1 further characterized in that the different bandgap material of the emitter-base barrier region is selectively etchable with respect to an adjacent part of the base region, and that a base connection contacts the base region at an area of the adjacent part of the base region from which said different bandgap material is removed.

7. A transistor as claimed in claim 1 further characterized in that the wider bandgap material is gallium aluminum arsenide and at least the adjacent part of the base region is gallium arsenide.

* * * * *